United States Patent [19]

Bowman

[11] Patent Number: 4,513,241
[45] Date of Patent: Apr. 23, 1985

[54] FOLDBACK CURRENT LIMITING DRIVER

[75] Inventor: Melvin B. Bowman, Dearborn, Mich.

[73] Assignee: Ford Motor Company, Dearborn, Mich.

[21] Appl. No.: 481,426

[22] Filed: Apr. 1, 1983

[51] Int. Cl.³ .............................................. G05F 1/46
[52] U.S. Cl. .................................. 323/285; 323/908; 307/270
[58] Field of Search ............... 323/273, 276, 277, 278, 323/279, 280, 281, 283, 285, 311, 312, 315, 316, 317, 901, 908; 307/270, 544, 546, 547, 548, 567, 412

[56] References Cited

U.S. PATENT DOCUMENTS

| | | | |
|---|---|---|---|
| 3,328,673 | 6/1967 | Nuckolls | 323/901 X |
| 3,470,457 | 9/1969 | Howlett | 323/280 |
| 3,753,079 | 8/1973 | Trilling | 323/278 |
| 3,801,894 | 4/1974 | Spiegel | 323/276 |
| 3,959,713 | 5/1976 | Davis et al. | 323/278 |
| 4,051,392 | 9/1977 | Rosenthal et al. | 323/315 |
| 4,180,768 | 12/1979 | Ferraro | 323/278 |
| 4,280,091 | 7/1981 | Hilter | 323/315 |
| 4,392,103 | 7/1983 | O'Sullivan et al. | 323/285 |

*Primary Examiner*—Peter S. Wong
*Assistant Examiner*—Judson H. Jones
*Attorney, Agent, or Firm*—Peter Abolins; Robert D. Sanborn

[57] ABSTRACT

A voltage driving circuit for a load requiring foldback current limiting characteristics, current limiting means and current latching means. The current latching means monitors the load current until a predetermined limit is reached, then latches the load current at a predetermined level lower than the predetermined limit until a logic signal is applied to the voltage driving circuit to turn off the load current. Such reduction in the current magnitude of the output current provides lower power dissipation in the load, a faster load turnoff time as a result of less energy stored in the load, and a more precise control of a variable duty cycle output.

8 Claims, 2 Drawing Figures

FOLDBACK CURRENT LIMITING DRIVER

FOLDBACK CURRENT LIMITING DRIVER

BACKGROUND OF THE INVENTION

1. Field of the Invention

This relates to current limiting drivers for driving loads that require a turn-on current that is higher than the desired maintenance current magnitude.

2. Prior Art

Various overload protection circuits using current limiting are known. For example, U.S. Pat. No. 3,801,894 issued to Spiegel teaches a power supply in which the output of a comparator amplifier is applied to a current limiting transistor, which in turn limits the load current upon the occurrence of a short circuit in the load. A feedback means is provided such that the load voltage is compared to a reference voltage. When the load voltage exceeds the reference voltage, the comparator turns on, thereby also turning on the current limiting transistor. The current limiting transistor serves as a bias control such that, when turned on, it limits the conductivity of output control transistors, thus limiting the output current.

U.S. Pat. No. 3,470,457 issued to Howlett teaches a voltage regulator which utilizes a cascaded amplifier pair to provide constant voltage at its output. The first amplifier serves as a voltage stabilizer, producing constant output voltage to the second amplifier. The second amplifier acts as an inverter and gain device. Feedback is provided from the second amplifier to the positive input of the first amplifier to stabilize the voltage of the first amplifier. However, the Howlett circuit does not produce a latching operation to stabilize the voltage of the second transistor.

U.S. Pat. No. 3,753,079 issued to Trilling teaches a foldback current limiter in which a diode is used as the regulating device. A conventional current limiter is provided with a Darlington pair power amplifier and a diode connected in shunt to the base and the emitter of a transistor within the current limiter. Should a short circuit occur in the load, the voltage across the diode is increased such that the base emitter voltage of the transistor within the current limits your increases to a point where the transistor is turned on. Since the collector of this transistor is connected to the emitter of the main current limiter transistor, this also serves to reduce the conduction of the main current limiter transistor, thereby serving ultimately to limit the load current. Subsequent operation of the current limiter is governed by the first transistor. That is, subsequent to initiating the current limiting operation, the input transistor controls the limiting operation. It would be advantageous to have the limiting operation carried out independently of the subsequent voltage of the input transistor.

U.S. Pat. No. 4,051,392 issued to Rosenthal et al discloses a startup current limiter driver in which the load current increases to a certain point, and is constant thereafter. A starting circuit initiates current flow and is automatically disconnected from the circuit limiter once the limiter is fully energized. A first transistor is provided by the starter circuit which sequentially energizes the transistors of the current limiter. When the transistors within the current limiter are sufficiently energized, such that the voltage at a common node reaches a particular value, a second transistor is turned on in the starting circuit to turn off the first transistor. However, it would be desirable that the internal voltage transition point is not a function of turn-on voltages of transistors within the current limiter but only a function of preselected resistor values and configurations. Further, the above cited patents are intended as overload protection circuits and return to normal operation when the overload condition is removed. It would be desirable to use a circuit in which normal operation provides an initial application of full voltage to the load until a predetermined current is reached, at which time the current folds back to a specific current limit level and latches at that current level until the input to the circuit is removed. These are some of the problems this invention overcomes.

SUMMARY OF THE INVENTION

When driving an inductive load requiring high initial current and lower maintenance current, a circuit in accordance with an embodiment of this invention, supplies the load with a high initial or starting current which is greater than the current needed to maintain the operation of the load. When the starting current reaches a predetermined value, lower maintenance currents are provided to the load. A comparator is coupled to an operational amplifier through a transistor. The output of the operational amplifier is coupled to an output transistor which has an emitter connected to ground through a load current sensing resistor to provide negative feedback to the operational amplifier and a positive feedback to the comparator. The input to the circuit is through a connection to the base of the output transistor.

As a result, there is a lower power dissipation in the load and a faster load turnoff time because less energy is stored in the field of the inductive load. Such action provides more precise control of a variable duty cycle type output.

DETAILED DESCRIPTION OF THE INVENTION

Figure 1:
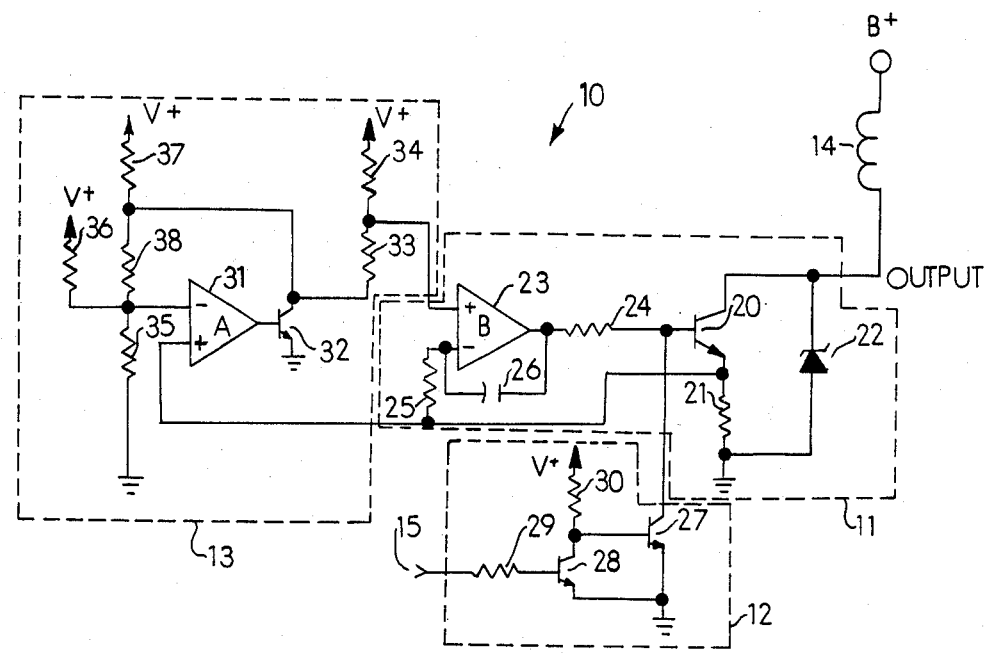
FIG. 1 is a schematic drawing of a foldback current limiting driver in accordance with an embodiment of this invention.

Referring to FIG. 1, a foldback current limiting driver circuit 10 includes a current limiting circuit 11, a turn-on/turn-off circuit 12, and a peak detection and current latching circuit 13 which together control current through a load 14 in accordance with an applied voltage at input 15.

Current limiting circuit 11 includes a transistor 20 which has a collector coupled to load 14 and an emitter coupled to ground through a current sense resistor 21. A Zener diode 22 is connected between the collector of transistor 20 and ground. An operational amplifier 23 has an output connected through a resistor 24 to the base of transistor 20. The emitter of transistor 20 is connected to the negative input of operational amplifier 23 through a resistor 25. A capacitor 26 is connected between the output of operational amplifier 23 and the negative input of operational amplifier 23.

Turn-on/turn-off circuit 12 has a transistor 27 with a collector connected to the base of transistor 20 and an emitter connected to ground. The base of transistor 27 is connected to the collector of a transistor 28. The emitter of transistor 28 is connected to ground and the base of transistor 28 is connected through a resistor 29 to input 15. A voltage source V is connected through a resistor 30 to the collector of transistor 28.

Current latching circuit 13 has a comparator 31 with an output connected to the base of a transistor 32. The emitter of transistor 32 is grounded and the collector of transistor 32 is connected through the series combination of a resistor 33 and a resistor 34 to a voltage source v. The positive input of operational amplifier 23 is connected to a node between resistors 33 and 34. The positive input of comparator 31 is connected to the emitter of transistor 20. The negative input of comparator 31 is connected to ground through a resistor 35. A voltage source v is connected to the negative input of comparator 31 through a resistor 36 which is very much larger than resistor 35 in magnitude. The voltage source v is also connected to the negative input of comparator 31 through the series combination of resistors 37 and 38. The collector of transistor 32 is connected to a node between resistors 37 and 38.

In operation, when a logic input applied to input 15 is shifted high, output transistor 20 is also shifted high and conducts. This causes a voltage drop across resistor 21 which activates the positive feedback loop to the positive input of comparator 31. As the load current of driver circuit 10 increases, a point is reached, as determined by the voltage dividers and discrete resistors in driver circuit 10 where the voltage applied to the positive input of comparator 31 is greater than the reference voltage applied to the negative input of comparator 31. At this point, the output of comparator 31 goes high. As a result, latching transistor 32 turns on thus pulling the applied voltage at the negative input to comparator 31 toward the ground voltage magnitude and latching the output of comparator 31 high.

Operational amplifier 23, along with output transistor 20, and the negative feedback loop from sensor resistor 21 to the negative input of operational amplifier 23 serve as a current limiter to limit the output current as a function of the constant voltage provided to it by latched transistor 32. That is, when transistor 32 conducts, the voltage applied to the positive input of operational amplifier 23 is the voltage drop across resistor 33 or the voltage, V, multiplied by the ratio of the magnitudes of resistor 33 to the sum of the magnitudes of resistors 33 and 34. In this manner, comparator 31 initiates the operation of the current limiter circuit 11 only after the load current has risen to a certain level. That is, when the comparator 31 has turned on.

More specifically, with an intitially low input applied to input 15, output transistor 20 is turned off and the output current through solenoid 14, through the emitter-collector circuit of transistor 20 and through sense resistor 21 is zero. In this state, ground is applied through sense resistor 21 to the positive input of comparator 31 and to the negative input of operational amplifier 23. The negative input of comparator 31 will be held at a slightly positive potential because of the pulling up action of resistor 36. That is, resistor 36 is chosen to be very much larger than resistor 35, so that there is a small voltage drop across resistor 35 as a result of current flow through resistors 36 and 35. In this state, the output of comparator 31 will be low, turning transistor 32 off and maintaining a voltage level V at the positive input of operational amplifier 23. This input condition to amplifier 23 will insure a high level at the output of amplifier 23.

When the logic input at input 15 to driver circuit 10 is switched high, transistor 20 is turned on. As the load current through load 14 increases, the voltage across resistor 21 increases to a point at which it exceeds the voltage at the negative input to comparator 31. When this happens, the output of comparator 31 is switched to a high logic level. The switch point is determined by the voltage divider network including resistors 37, 38, 35, 34 and 33. Advantageously, the magnitude of resistor 37 is very small relative to the magnitude of the sum of resistors 33 and 34. This will substantially reduce the effect of resistors 33 and 34 on the voltage at the negative input of comparator 31 so that the switch point of comparator 31 may be considered to be determined only by the voltage divider network including resistors 35, 37 and 38.

When the output of comparator 31 switches to a high level, transistor 32 turns on pulling the junction of resistors 37, 38 and 33 toward a ground level. This accomplishes two functions. First, it places the negative input of comparator 31 almost at ground level and for all practical purposes latches the output of comparator 31 high. Second, it also places the positive input to amplifier 23 at a potential determined by the voltage divider network formed of resistors 34 and 33, and the saturated collector-emitter voltage, $V_{CE(SAT)}$, of transistor 32. Although $V_{CE(SAT)}$ of transistor 32 is small, it should be considered during circuit design and computation of the valve resistor 34. Thus, a voltage $V_{23}$ at the positive input of output amplifier 23 is computed by:

$$V_{23} = \left[ \frac{R33}{R33 + R34} (V^+ - V_{CE(SAT)}) \right] + V_{CE(SAT)}$$

After this latching has taken place, current limiting circuit 11 regulates the load current through load 14 such that the voltage potential at the junction of resistor 21 and the emitter of transistor 20 is held stable at the same potential as the positive input to amplifier 23. This state will remain until the logic input at input 15 to driver circuit 10 goes to a low logic level turning transistor 20 off and returning the system to the initial conditions described above.

Figure 2:
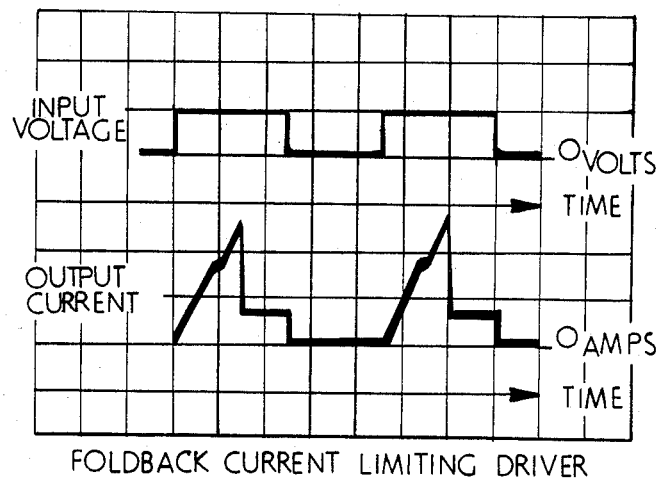
FIG. 2 is a graphical representation of input voltage to the foldback current limiting driver with respect to time and the corresponding output current of the foldback current limiting driver with respect to time, the output current having a reduced magnitude after an initial pulse, even with a constant input voltage.

Referring to FIG. 2, the input voltage applied to input 15 and the output current through load 14 are shown with respect to time. As noted above, when the input voltage goes high, the output current initially rises and then "folds back" and is latched at a current value less than the peak current. When the input voltage is low, the output current is maintained at a zero magnitude.

Zener diode 22 provides a conduction path so that a reverse current through load 14 does not cause damage to transistor 20. The typical parameters for the values of the components of driver circuit 10 are as follows:

Resistor 21—0.1 ohm
Resistor 24—100 ohms
Resistor 25—10 K ohm
Resistor 29—10 K ohm
Resistor 30—1.5 K ohm
Resistor 33—1 K ohm
Resistor 34—62.25 K ohms Resistor 35—1 K ohm
Resistor 36—36 meg. ohms
Resistor 37—1 K ohm
Resistor 38—11.5 K ohms Comparator 31—LM2904
Transistor 32—2N4401
Amplifier 23—LM2904
Capactior 26—1000 pf
Transistor 20—T1P121
Transistor 28—2N4401
Transistor 27—2N4401
Diode 22—IN5361

Various modifications and variations will no doubt occur to those skilled in the arts to which this invention pertains. For example, a particular type of transistors may be varied from that disclosed herein. These and all other variations which basically rely on the teachings through which this disclosure has advanced the art are properly considered within the scope of this invention.

I claim:

1. A voltage driving circuit having foldback current limiting characteristics comprising:
   input terminal means for receiving a logic signal;
   output terminal means for governing the passage of a current to a load;
   current limiting means coupled to said input terminal means and said output terminal means for applying a voltage to the load until a predetermined current limit level is reached;
   current latching means coupled to said current limiting means and to said input terminal means for latching the load current at a level lower than the predetermined current limit until a logic signal is applied to said input terminal means to turn off the load current, thereby providing lower power dissipation in the load and a faster load turn-off time as a result of less energy stored in the load and resulting in a more precise control of a variable duty cycle output;
   said current latching means including:
   a comparator having a negative input, a positive input coupled to said current limiting means and an output;
   a switching transistor having a base coupled to the output of said comparator, an emitter coupled to ground, and a collector coupled to a voltage source through a resistive voltage divider;
   a first resistance coupled between a voltage source and said negative comparator input;
   a second resistance and a third resistance coupled in series between a voltage source and said negative comparator input;
   a fourth resistance coupled between said negative input and ground;
   said collector of said switching transistor being coupled to a junction between said second and third resistors; and
   said resistive voltage divider including the series combination of a fifth resistor and a sixth resistor; and
   said current limiting means including:
   a drive transistor having a collector-emitter current path coupled in series with the load and a base coupled to said input terminal means for responding to logic signals applied to said input terminal means so that when a low input is applied to said input terminal said driver transistor is turned off and the load current is zero;
   an operational amplifier means having a first positive input, a second negative input and an output coupled to said base of said drive transistor;
   said positive input of said operational amplifier means being coupled to a junction between said fifth and sixth resistors; and
   a sense resistor coupled in series with said collector-emitter path between said drive transistor and a ground reference.

2. A voltage driving circuit as recited in claim 1 wherein:
   said first positive input of said operational amplifier is coupled to a voltage source; and
   said second negative input of said operational amplifier means is coupled to a junction between said sense resistor and said drive transistor.

3. A voltage driving circuit as recited in claim 2 further comprising:
   a seventh resistor coupled between said negative input of said operational amplifier means and said junction between said drive transistor and said sense resistor; and
   a capacitor coupled between said output and said negative input of said operational amplifier means.

4. A voltage driving circuit as recited in claim 3 further comprising:
   a coupled two transistor means having a base means and a collector means coupled to the base of said drive transistor for turning on and off said drive transistor in response to a logic signal applied to said input terminal means.

5. A voltage driving circuit as recited in claim 4 further comprising:
   a Zener diode coupled in parallel across said sense resistor and the collector-emitter path of said drive transistor so as to provide a discharge current path for an inductive load thereby protecting said voltage driving circuit from overvoltage breakdown.

6. A voltage driving circuit having foldback current limiting characteristics comprising:
   an input terminal means for receiving a logic signal;
   a current limiting circuit means for restricting current through a load to a predetermined maximum value and coupled to said input terminal means;
   a latching transistor means coupled to the input of said current limiting circuit means;
   a comparator means having an output coupled to the base of said latching transistor means, a negative input to said comparator coupled to a reference voltage, and a positive input to said comparator means coupled to said current limiting circuit and receiving a signal indicative of the magnitude of load current for latching the load current at a level lower than said predetermined maximum value until a logic signal is applied to said input terminal means to turn off the load current, thereby providing lower power dissipation in the load and a faster load turnoff time as a result of less energy stored in the load and resulting in a more precise control of a variable duty cycle output;
   a negative input of said comparator means being connected to ground through a first resistor, connected to a voltage source through a second resistor, and connected to the voltage source through a combination of a third and fourth resistor; and said latching transistor means being connected to the voltage source through the series combination of a fifth and sixth resistor and is also connected to a node intermediate said third and fourth resistor, the magnitudes of the resistors determining the switching points of the circuit.

7. A voltage driving circuit as recited in claim 6 wherein said third resistor is substantially smaller in magnitude than the sum of the magnitudes of said fifth and sixth resistors so that the switching point of said comparator means is substantially determined by the magnitudes of said first, third and fourth resistors.

8. A voltage driving circuit as recited in claim 7 wherein the magnitudes of
said first resistor is about 1 K ohm
said second resistor is about 1 meg ohm
said third resistor is about 1 K ohm
said fourth resistor is about 11.5 K ohms
said fifth resistor is about 62.25 K ohms
said sixth resistor is about 1 K ohm.

* * * * *